(12) United States Patent
Ma et al.

(10) Patent No.: US 10,792,688 B2
(45) Date of Patent: Oct. 6, 2020

(54) VACUUM EVAPORATION DEVICE AND SYSTEM

(71) Applicants: BOE Technology Group Co., Ltd., Beijing (CN); Ordos Yuansheng Optoelectronics Co., Ltd., Ordos, Inner Mongolia (CN)

(72) Inventors: Qun Ma, Beijing (CN); Da Zhou, Beijing (CN); Zailong Mo, Beijing (CN); Jin Xu, Beijing (CN)

(73) Assignees: BOE TECHNOLOGY GROUP CO., LTD., Beijing (CN); ORDOS YUANSHENG OPTOELECTRONICS CO., LTD., Ordos (CN)

( * ) Notice: Subject to any disclaimer, the term of this patent is extended or adjusted under 35 U.S.C. 154(b) by 356 days.

(21) Appl. No.: 15/708,537

(22) Filed: Sep. 19, 2017

(65) Prior Publication Data

US 2018/0078964 A1  Mar. 22, 2018

(30) Foreign Application Priority Data

Sep. 19, 2016 (CN) .................. 2016 2 1064267 U

(51) Int. Cl.
*C23C 16/00* (2006.01)
*B05B 14/00* (2018.01)
*C23C 14/24* (2006.01)
*B05B 1/28* (2006.01)

(52) U.S. Cl.
CPC ............. *B05B 14/00* (2018.02); *B05B 1/28* (2013.01); *C23C 14/243* (2013.01)

(58) Field of Classification Search
CPC .................................................. C23C 14/243
See application file for complete search history.

(56) References Cited

U.S. PATENT DOCUMENTS

| | | | | |
|---|---|---|---|---|
| 4,662,981 A | * | 5/1987 | Fujiyasu | C30B 23/066 117/93 |
| 2010/0139564 A1 | * | 6/2010 | Lee | C23C 14/243 118/726 |
| 2013/0295716 A1 | * | 11/2013 | Kawato | C23C 14/042 438/99 |
| 2014/0170315 A1 | * | 6/2014 | Kang | C23C 14/243 427/248.1 |

* cited by examiner

*Primary Examiner* — Keath T Chen
(74) *Attorney, Agent, or Firm* — Fay Sharpe LLP

(57) ABSTRACT

A vacuum evaporation device and system comprises a material container and a recycling structure, wherein a nozzle is arranged on the upper end surface of the material container; the recycling structure is arranged around the nozzle; and the recycling structure is configured to receive material when the material sprayed from the nozzle is fallen down. By arranging the recycling structure, the deposited material is received when it is fallen down, so that the nozzle is prevented from being clogged by the fallen material.

9 Claims, 3 Drawing Sheets

VACUUM EVAPORATION DEVICE AND SYSTEM

This application claims priority to the Chinese Patent Application No. 201621064267.8, entitled as "Vacuum Evaporation Device", filed to State Intellectual Property Office on Sep. 19, 2016, which is incorporated by reference in its entirety.

FIELD

The present disclosure relates to evaporation technology, and more particularly, to a vacuum evaporation device and system.

BACKGROUND

With continuous development of electronic technology, organic light-emitting display devices have been applied widely as a new generation of display devices. In an organic light-emitting panel manufacturing process, an organic light-emitting layer is formed on a substrate; that is, an organic light-emitting diode is deposited on the substrate. At present, the organic light-emitting diode is deposited mainly through a heating evaporation coating manner. However, in an evaporating process, material vapor ejected from a material container is jetted in all directions with the maximum jetting angle of 180 degrees. Thus, the material vapor radiated outside the substrate is wasted as the area of the substrate is limited, reducing the material utilization ratio, thereby increasing the manufacturing cost.

FIG. 1 is a schematically structural view of a vacuum evaporation device 0 in the prior art. As shown in FIG. 1, in the prior art, an angle plate 01 is arranged on a material container 00 to limit a jetting angle of the material container, so that the material vapor is prevented from being jetted outside the substrate, thereby solving the problem that the material vapor radiated outside the substrate 02 is wasted.

However, when the vacuum evaporation device is utilized to perform evaporation coating, the evaporation material evaporated on the angle plate is accumulated over time of evaporation, and is likely to fall. This may cause the nozzle to be clogged, thereby affecting the production capacity and increasing the production cost.

SUMMARY

In order to solve the problem that a nozzle is clogged by fallen material deposited on the angle plate, the embodiments of the present disclosure provide a vacuum evaporation device and system, and the technical solution thereof is as follows:

In a first aspect of the present disclosure, there is provided a vacuum evaporation device, comprising:

a material container and a recycling structure, wherein a nozzle is arranged on the upper end surface of the material container; the recycling structure is arranged around the nozzle; and the recycling structure is configured to receive material when the material sprayed from the nozzle is fallen down.

Optionally, the recycling structure comprises an angle plate around the nozzle; and the angle plate is of a stepped bending structure extending in a direction away from the nozzle.

Optionally, the recycling structure comprises an angle plate around the nozzle; the angle plate is perpendicular to the upper end surface of the material container; a baffle is arranged at the inner side of the upper end of the angle plate; and at least one recycling plate is arranged on the inner wall of the angle plate.

Optionally, an orthographic projection of each recycling plate and an orthographic projection of the nozzle on the upper end surface are not overlapped.

Optionally, the orthographic projection of each recycling plate on the upper end surface is ring-shaped.

Optionally, at least two recycling plates are arranged on the inner wall of the angle plate; one end of each recycling plate is connected to the inner wall of the angle plate; and opening areas of the at least two recycling plates are decreased gradually in the direction away from the nozzle.

Optionally, each recycling plate is an upswept curved plate, and a protrusion direction of the upswept curved plate is toward the upper end surface.

Optionally, each recycling plate is a flat plate and an included angle between each flat plate and the angle plate is an acute angle.

Optionally, the at least two recycling plates are arranged at an equal interval in the height direction of the angle plate.

Optionally, a shielding plate is arranged at each protruding bending structure of the angle plate, and a plane of the shielding plates intersects a plane of the upper end surface.

Optionally, a structure inclined towards the direction of the angle plate is arranged at the end not connected to the angle plate, of each recycling plate.

Optionally, the angle plate is detachably connected to the material container.

Optionally, each recycling plate is detachably connected to the angle plate.

Optionally, the baffle extends towards the nozzle; and an orthographic projection of the baffle and an orthographic projection of the nozzle on the upper end surface are not overlapped.

Optionally, the orthographic projection of the baffle on the upper end surface is positioned in that of each recycling plate on the upper end surface.

In a second aspect of the present disclosure, there is provided a vacuum evaporation system comprising the plurality of vacuum evaporation devices described in the first aspect.

Optionally, the vacuum evaporation system comprises at least three vacuum evaporation devices which are arranged in a linear array manner.

The technical solution provided by the present disclosure has the following beneficial effects:

in the vacuum evaporation device and system provided by the present disclosure, the arranged recycling structure is capable of receiving the deposited material when it is fallen down, so that the nozzle is prevented from being clogged by the fallen material.

BRIEF DESCRIPTION OF THE DRAWINGS

In order to more clearly illustrate the technical solution of the present disclosure, the followings will briefly describe the drawings for illustrating the embodiments of the present disclosure. It is apparent that the drawings described below are merely used for illustrating part of embodiments in the present disclosure, and for those skilled in the art, other drawings may be obtained based on these drawings without any creative effort.

DETAILED DESCRIPTION OF THE EMBODIMENTS

The present disclosure will be described in further detail with reference to the enclosed drawings, to clearly present the objects, technique solutions, and advantages of the present disclosure.

Figure 1:
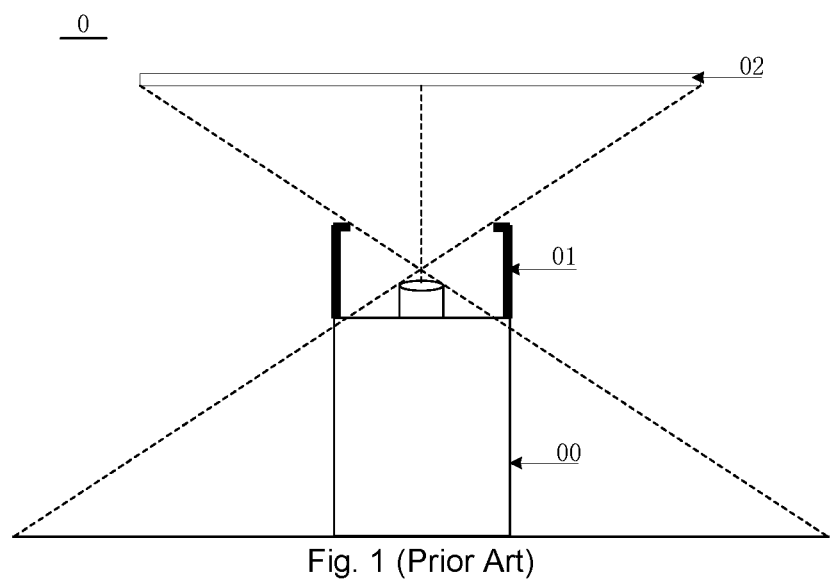
FIG. 1 is a schematically structural view of a vacuum evaporation device in the prior art.
Figure 2:
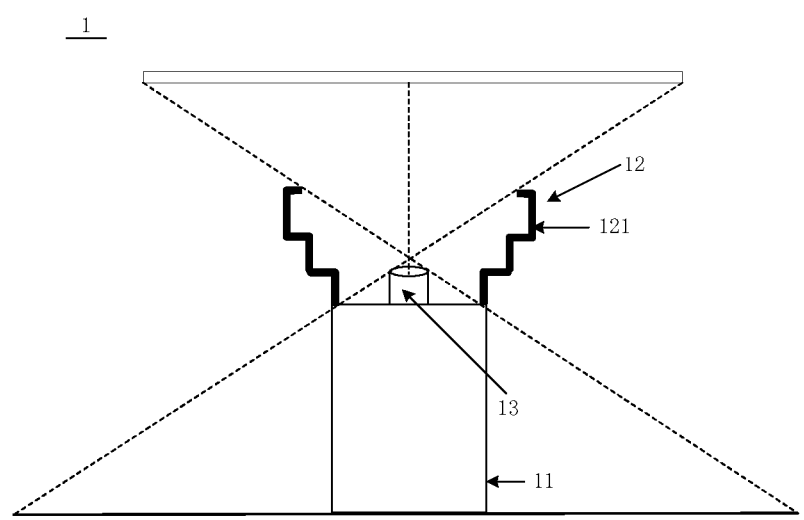
FIG. 2 is a schematically structural view of a vacuum evaporation device according to an exemplary embodiment of the present disclosure.
Figure 3:
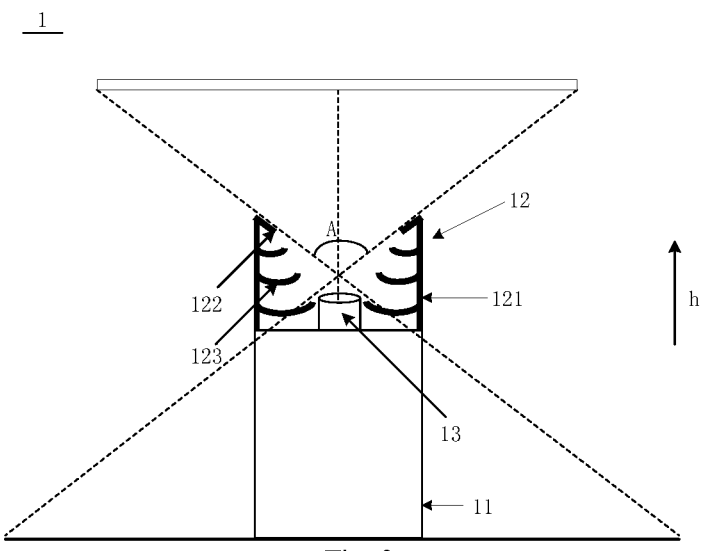
FIG. 3 is a schematically structural view of another vacuum evaporation device according to an exemplary embodiment of the present disclosure.

The embodiments of the present disclosure provide a vacuum evaporation device 1 as shown in FIG. 2 and FIG. 3.

The vacuum evaporation device comprises: a material container 11 and a recycling structure 12.

A nozzle 13 is arranged on the upper end surface of the material container 11; the recycling structure 12 is arranged around the nozzle 13; and the recycling structure 12 is capable of receiving material when the material sprayed from the nozzle 13 is fallen down.

In conclusion, according to the vacuum evaporation device provided by the embodiments of the present disclosure, the arranged recycling structure is capable of receiving the deposited material when it is fallen down, so that the nozzle is prevented from being clogged by the fallen material. Moreover, the material received by the recycling structure may be reused, effectively reducing the production cost.

Optionally, as shown in FIG. 2, the recycling structure 12 may comprise an angle plate 121 around the nozzle; and the angle plate 121 adopts a stepped bending structure extending in a direction away from the nozzle 13.

The recycling structure provided by the embodiment of the present disclosure may be the angle plate adopting the stepped bending structure and extending in the direction away from the nozzle, so that when the material deposited on the inner wall of the angle plate is fallen down, it may be received by lateral steps, preventing the nozzle from being clogged by the fallen material.

Figure 4:
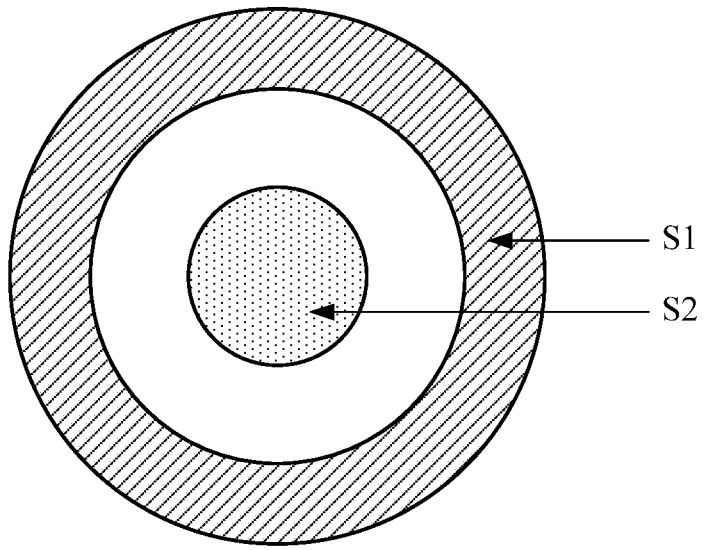
FIG. 4 shows a schematic view of orthographic projections of a recycling plate and a nozzle on an upper end surface of a material container according to an exemplary embodiment of the present disclosure.

Optionally, as shown in FIG. 3, the recycling structure 12 may comprise an angle plate 121 around the nozzle; the angle plate 121 is perpendicular to the upper end surface of the material container 11; a baffle 122 is arranged at the inner side of the upper end of the angle plate 121; and at least one recycling plate 123 is arranged on the inner wall of the angle plate 121. In practice, there are at least two recycling plates 123. An orthographic projection of each recycling plate 123 on the upper end surface of the material container 11 may be ring-shaped, for example, be annular, square-ring-shaped or the like. FIG. 4 shows an orthographic projection S1 of a recycling plate on the upper end surface of the material container 11. Referring to FIG. 4, the orthographic projection S1 may be annular. One end of each recycling plate 123 is connected to the inner wall of the angle plate 121. Referring to FIG. 3, opening areas of the at least two recycling plates 123 are decreased gradually in the direction away from the nozzle 13.

It should be noted that in the structures shown in FIG. 2 and FIG. 3, the angle plate 121 is arranged along the periphery of the upper end surface of the material container 11, so the shape of the orthographic projection of the angle plate 121 on the upper end surface of the material container 11 may be the same as the shape of the upper end surface of the material container 11.

The recycling structure provided by the embodiment of the present disclosure may also be an angle plate whose inner side of the upper end is provided with the baffle and the inner wall is provided with the recycling plates. The recycling plates may be connected to the angle plate through welding, or may be detachably connected to the angle plate. For example, a plurality of inserting grooves may be formed in the angle plate, and each recycling plate may be inserted in the corresponding inserting groove. The recycling plates and the angle plate may be detachably connected, so as to facilitate the maintenance and cleaning of the recycling plates later. When the material deposited on the inner wall of the angle plate is fallen down, it may be received by the recycling plates arranged on the inner wall, so that the nozzle is prevented from being clogged by the fallen material. In practice, the recycling plates may be connected to the inner wall of the angle plate, and the opening areas of the recycling plates are constant in the direction away from the nozzle; or the recycling plates may be connected to the inner wall of the angle plate, and the opening areas of the recycling plates are reduced in the direction away from the nozzle. As the opening areas of the recycling plates are decreased gradually, the manufacturing cost is reduced, and the area of the recycling plate the closest to the nozzle is the largest. When the material received on the upper recycling plate with a smaller area is fallen down or the recycling plate with a smaller area is not able to fully receive the fallen material, the bottom recycling plate with the largest area may receive the fallen material.

Further, referring to FIG. 3, each recycling plate 123 is an upswept curved plate. By choosing the upswept curved plates, the fallen material may be received more effectively. The upswept curved plate refers to one whose protrusion direction is toward the upper end surface of the material container 11.

Figure 5:
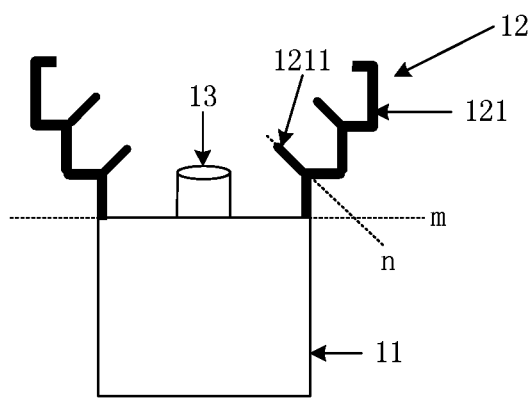
FIG. 5 is a schematic design diagram of a recycling structure according to an exemplary embodiment of the present disclosure.

Optionally, for the stepped angle plate shown in FIG. 2, referring to FIG. 5, a shielding plate 1211 may be further arranged at each protruding bending structure of the angle plate 121. A plane n of the shielding plates 1211 intersects a plane m of the upper end surface of the material container 11. That is, there is a certain included angle between each shielding plate 1211 and the corresponding lateral step in the angle plate 121, so that the material received by the lateral steps is unlikely to fall down. The plane of the shielding plates 1211 means the plane of the shielding plate 1211 with the largest area. In addition, the orthographic projections of the shielding plates 1211 on the upper end surface of the material container 11 may be annular, and the annular orthographic projections are not overlapped with the orthographic projection of the nozzle 13 on the upper end surface.

Figure 6:
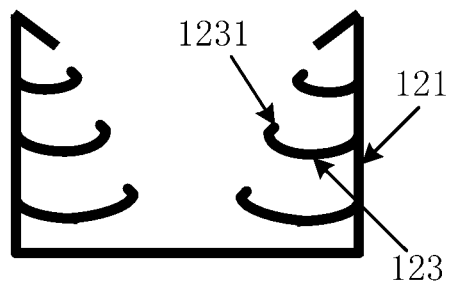
FIG. 6 is a schematic design diagram of another recycling structure according to an exemplary embodiment of the present disclosure.

Optionally, for the recycling structure 12 shown in FIG. 3, the recycling plates may be those as shown in FIG. 6. Referring to FIG. 6, a structure 1231 inclined towards the direction of the angle plate 121 is arranged at the end not connected to the angle plate 121, of each recycling plate 123, so that the material received on the recycling plates 123 is unlikely to fall down.

Figure 7:
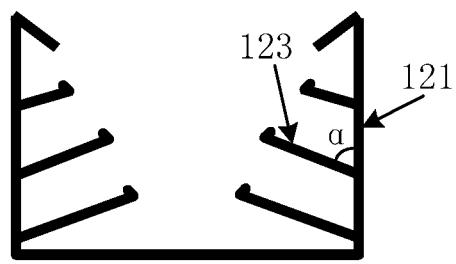
FIG. 7 is a schematic design diagram of yet another recycling structure according to an exemplary embodiment of the present disclosure.

In the embodiments of the present disclosure, the shapes of the specific recycling plates are not limited, and other shapes thereof may be selected according to an actual situation. For example, as shown in FIG. 7, each recycling plate 123 may be a flat plate, and an included angle α between each flat plate and the angle plate 121 is an acute angle to ensure that the recycling plates can effectively receive and recycle the material. The angles between the recycling plates and the angle plate may be the same or different, and the embodiments of the present disclosure are not limited thereto.

Further, referring to FIG. 4, orthographic projections S1 of the recycling plates 123 on the upper end surface and an orthographic projection S2 of the nozzle 13 on the upper end surface are not overlapped, so that the recycling plates do not affect the normal working of the nozzle. In addition, the baffle 122 may extend towards the nozzle 13, and the orthographic projection of the baffle 122 and the orthographic projection of the nozzle 13 on the upper end surface are not overlapped, so that the baffle does not affect the normal working of the nozzle.

In practice, both the recycling plates and the baffle do not intersect with an evaporation angle of the vacuum evaporation device during working. The evaporation angle is an ejection angle of a material ejected from the uppermost end of the angle plate and capable of just covering the substrate when the vacuum evaporation device works. Exemplarily, the evaporation angle may be the angle A shown in FIG. 3. Thus, it is ensured neither the recycling plates nor the baffle affects the normal working of the vacuum evaporation device. In practice, during processing different substrates, corresponding evaporation angles are different. When the recycling structure corresponds to different evaporation angles, corresponding adjustment may be required. Meanwhile, the orthographic projection of the baffle 122 on the upper end surface is within those of the recycling plates 123 on the upper end surface, so that when the material deposited on the baffles is fallen down, it can be received by the recycling plates.

Optionally, as shown in FIGS. 3, 6 and 7, the at least two recycling plates 123 in the recycling structure 12 are arranged at the equal interval in the height direction h of the angle plate 121. In the embodiments of the present disclosure, the arrangement manners of the recycling plates are not limited. For example, the recycling plates may be arranged at unequal intervals in the height direction of the angle plate.

In the embodiments of the present disclosure, the angle plate 121 is detachably connected to the material container 11. For example, an inserting groove may be formed in the upper end surface of the material container 11, and the angle plate 121 may be inserted in the inserting groove. Or, a plurality of screw holes may be formed in the upper end surface of the material container 11. A connecting surface parallel to the upper end surface is arranged at the end of the angle plate 121 which is connected to the material container 11; a plurality of screw holes may be formed in the connecting surface; and the angle plate 121 and the material container 11 may be connected to each other via a screw. The angle plate 121 is detachably connected to the material container 11 to facilitate maintenance and cleaning of the angle plate later.

Figure 8:
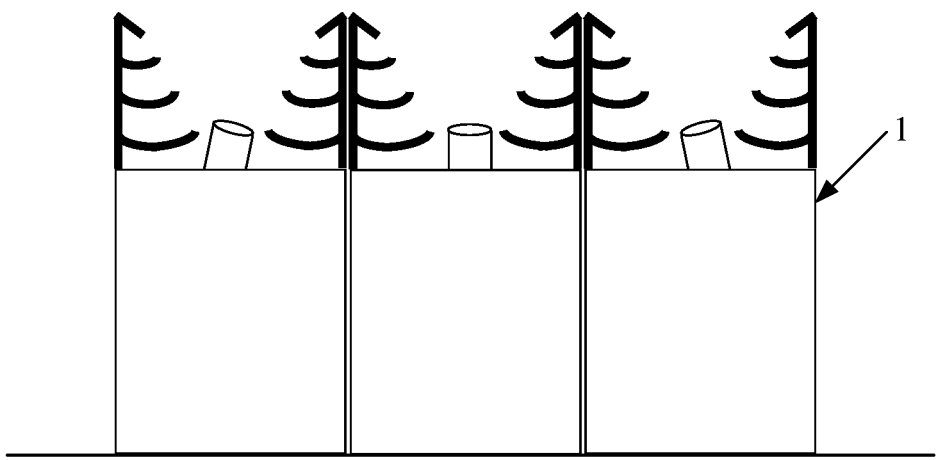
FIG. 8 is a schematically structural diagram of a vacuum evaporation system according to an exemplary embodiment of the present disclosure.

It should be noted that when an evaporation coating operation is performed on the substrate, a plurality of vacuum evaporation devices may be assembled together for performing the evaporation coating operation on the substrate. FIG. 8 is a schematically structural view of a vacuum evaporation system according to an exemplary embodiment of the present disclosure. As shown in FIG. 8, the system may comprise a plurality of vacuum evaporation devices, and each vacuum evaporation device may be the vacuum evaporation device 1 as shown in FIG. 2 or FIG. 3 according to the embodiments of the present disclosure. Further, the system may comprise at least three vacuum evaporation devices which may be arranged in a linear array manner. Exemplarily, as shown in FIG. 8, the three vacuum evaporation devices 1 may be assembled together. When assembling, the three vacuum evaporation devices 1 may be arranged in a linear array manner. Moreover, longitudinal directions of the material containers of all the vacuum evaporation devices 1 are parallel to one another, and are parallel to the height directions of angle plates, so that it is ensured that the recycling structures arranged on the vacuum evaporation devices do not affect one another. Meanwhile, in practice, incline angles of nozzles of the vacuum evaporation devices may be adjusted according to a situation. As shown in FIG. 5, the nozzles of the vacuum evaporation devices at the left and right sides may be inclined inwards.

In conclusion, according to the vacuum evaporation device provided by the embodiments of the present disclosure, the arranged recycling structure is capable of receiving the deposited material when it is fallen down, so that a condition that the nozzle is not clogged by the fallen material is ensured. Moreover, the material received by the recycling structure may be reused, effectively reducing the production cost.

The above embodiments are only preferred embodiments of the present disclosure, and are not intended to limit the present disclosure. Thus, any modification, equivalent replacement, improvement and so on made within the spirit and principle of the present disclosure shall be encompassed by the protection scope of the present disclosure.

What is claimed is:

1. A vacuum evaporation device, comprising:
   a material container and a recycling structure, wherein
   a nozzle is arranged on an upper end surface of the material container; the recycling structure is arranged around the nozzle; the recycling structure is configured to receive material when the material sprayed from the nozzle is fallen down;
   wherein the recycling structure comprises an angle plate around the nozzle; the angle plate is perpendicular to the upper end surface of the material container; a baffle is arranged at an inner side of an upper end of the angle plate;
   wherein at least two recycling plates are arranged on the inner wall of the angle plate, one end of each recycling plate is connected to the inner wall of the angle plate, the other end of the at least two recycling plates and the inner end of the baffle are in a line at one side of the at least two recycling plates, and opening areas of the at least two recycling plates are increased gradually in a direction away from the nozzle;
   wherein each recycling plate is an upswept curved plate, and a protrusion direction of each upswept curved plate is toward the upper end surface; and wherein the baffle inclines downward and extends towards the nozzle; and an orthographic projection of the baffle and an orthographic projection of the nozzle on the upper end surface are not overlapped.

2. The vacuum evaporation device of claim 1, wherein an orthographic projection of each recycling plate and an orthographic projection of the nozzle on the upper end surface are not overlapped.

3. The vacuum evaporation device of claim 1, wherein the orthographic projection of each recycling plate on the upper end surface is ring-shaped.

4. The vacuum evaporation device of claim 1, wherein the at least two recycling plates are arranged at an equal interval in a height direction of the angle plate.

5. The vacuum evaporation device of claim 1, wherein the angle plate is detachably connected to the material container.

6. The vacuum evaporation device of claim 1, wherein each recycling plate is detachably connected to the angle plate.

7. The vacuum evaporation device of claim 1, wherein the orthographic projection of the baffle on the upper end surface is positioned in that of each recycling plate on the upper end surface.

8. A vacuum evaporation system, comprising: a plurality of vacuum evaporation devices; wherein each vacuum evaporation device comprises:
a material container and a recycling structure, wherein
a nozzle Is arranged on an upper end surface of the material container; the recycling structure is arranged around the nozzle; the recycling structure is configured to receive material when the material sprayed from the nozzle is fallen down;
wherein the recycling structure comprises an angle plate around the nozzle; the angle plate is perpendicular to the upper end surface of the material container: a bathe is arranged at an inner side of an upper end of the angle plate;
wherein at least two recycling plates are arranged on the inner wall of the angle plate, one end of each recycling plate is connected to the inner wall of the angle plate, the other end of the at least two recycling plates and the inner end of the baffle are in a line at one side of the at least two recycling plates, and opening areas of the at least two recycling plates are increased gradually in a direction away from the nozzle;
wherein each recycling plate is an upswept curved plate, and a protrusion direction of each upswept curved plate is toward the upper end surface; and
wherein the baffle inclines downward and extends towards the nozzle; and an orthographic projection of the baffle and an orthographic projection of the nozzle on the upper end surface are not overlapped.

9. The vacuum evaporation system of claim 8, comprising: at least three vacuum evaporation devices which are arranged in a linear array manner.

\* \* \* \* \*